United States Patent
Ma et al.

(10) Patent No.: US 12,313,355 B2
(45) Date of Patent: May 27, 2025

(54) MULTI-HEADER PIPE DISTRIBUTING ANNULAR PRINTED CIRCUIT HEAT EXCHANGER

(71) Applicant: Xi'an Jiaotong University, Shaanxi (CN)

(72) Inventors: Ting Ma, Shaanxi (CN); Qiyuan Ma, Shaanxi (CN); Song He, Shaanxi (CN); Yang Cheng, Shaanxi (CN); Qiuwang Wang, Shaanxi (CN)

(73) Assignee: Xi'an Jiaotong University, Xi'an (CN)

( * ) Notice: Subject to any disclaimer, the term of this patent is extended or adjusted under 35 U.S.C. 154(b) by 0 days.

(21) Appl. No.: 18/895,602

(22) Filed: Sep. 25, 2024

(65) Prior Publication Data

US 2025/0012521 A1    Jan. 9, 2025

(51) Int. Cl.
*F28F 9/02*     (2006.01)
*H05K 7/20*     (2006.01)

(52) U.S. Cl.
CPC ......... *F28F 9/0243* (2013.01); *H05K 7/2039* (2013.01)

(58) Field of Classification Search
CPC ..... F28F 9/0243; H05K 7/2039; F28D 9/0012
See application file for complete search history.

(56) References Cited

U.S. PATENT DOCUMENTS

| 3,400,758 | A | * | 9/1968 | Lee | F28F 9/22 159/901 |
| 3,424,240 | A | * | 1/1969 | Stein | F28D 9/0012 165/DIG. 357 |
| 3,785,435 | A | * | 1/1974 | Stein | F28D 9/0012 165/80.1 |
| 4,470,454 | A | * | 9/1984 | Laughlin | F28F 3/086 165/DIG. 357 |
| 4,917,181 | A | * | 4/1990 | Kiernan, Jr. | F28D 9/0012 165/DIG. 357 |
| 4,993,223 | A | * | 2/1991 | Kretzinger | F28D 9/0018 165/166 |
| 5,014,775 | A | * | 5/1991 | Watanabe | B01D 35/306 228/183 |
| 5,050,668 | A | * | 9/1991 | Peterson | F28D 9/0018 165/81 |
| 5,063,663 | A | * | 11/1991 | Casterline | F28F 9/0219 29/890.047 |
| 5,511,612 | A | * | 4/1996 | Tajima | F28D 9/0012 165/906 |

(Continued)

*Primary Examiner* — Gordon A Jones

(57) ABSTRACT

The present invention discloses a multi-header pipe distributing annular printed circuit heat exchanger, and pertains to the technical field of heat exchangers, the heat exchanger includes: a front head configured to achieve same side entry and exit of a cold fluid; a core body with one end thereof connected with the front head and configured to achieve distributing of cold fluid entry and exit; a hot fluid inlet cavity provided in a middle portion of the core body and configured to achieve entry of a hot fluid; a shell sheathed outside the core body, and the shell and the core body provided with a gap for collecting the hot fluid; and a lower cover plate connected with one end of the core body and configured to block the hot fluid inlet cavity. The present invention can improve compactness and power density of the heat exchanger, reduce volume and weight.

4 Claims, 12 Drawing Sheets

(56) References Cited

U.S. PATENT DOCUMENTS

| | | | | |
|---|---|---|---|---|
| 5,787,977 | A * | 8/1998 | Yuasa | F28F 3/086 |
| | | | | 165/165 |
| 6,827,138 | B1 * | 12/2004 | Master | F28D 7/1607 |
| | | | | 165/162 |
| 9,766,019 | B2 * | 9/2017 | Eleftheriou | F02C 7/143 |
| 10,386,130 | B2 * | 8/2019 | Eckert | F28F 9/26 |
| 10,883,765 | B2 * | 1/2021 | Lewandowski | F28F 27/02 |
| 12,122,527 | B2 * | 10/2024 | Graves | H02K 9/00 |
| 2004/0055740 | A1 * | 3/2004 | Meshenky | F02B 37/013 |
| | | | | 165/125 |
| 2007/0199683 | A1 * | 8/2007 | Emrich | F28F 1/32 |
| | | | | 165/157 |
| 2008/0190593 | A1 * | 8/2008 | Wang | F28F 9/22 |
| | | | | 29/890.03 |
| 2009/0008074 | A1 * | 1/2009 | Vamvakitis | F28D 7/0083 |
| | | | | 165/177 |
| 2014/0265666 | A1 * | 9/2014 | Shoykhet | H02K 9/197 |
| | | | | 310/59 |
| 2014/0326439 | A1 * | 11/2014 | Heinio | B21D 53/04 |
| | | | | 29/890.039 |
| 2015/0285560 | A1 * | 10/2015 | Silversand | F23C 5/08 |
| | | | | 165/166 |
| 2015/0285572 | A1 * | 10/2015 | Fleitling | F28D 9/0006 |
| | | | | 165/167 |
| 2015/0300687 | A1 * | 10/2015 | Cui | F24H 1/406 |
| | | | | 126/110 R |
| 2016/0025419 | A1 * | 1/2016 | Pitkänen | B23P 15/26 |
| | | | | 165/158 |
| 2018/0106550 | A1 * | 4/2018 | Nelson | F28F 9/0243 |
| 2018/0164047 | A1 * | 6/2018 | Fard | F28F 1/08 |
| 2019/0195537 | A1 * | 6/2019 | Ooka | F28F 3/12 |
| 2019/0210494 | A1 * | 7/2019 | Longatte | B60N 2/5678 |
| 2019/0234690 | A1 * | 8/2019 | Sobolak | F28D 9/0012 |
| 2019/0298962 | A1 * | 10/2019 | May, Jr. | A61M 16/168 |
| 2019/0331436 | A1 * | 10/2019 | Dolderer | F28D 9/0043 |
| 2019/0360756 | A1 * | 11/2019 | Frechette | F28D 7/1607 |
| 2020/0025453 | A1 * | 1/2020 | Skoglösa | F28D 9/0037 |
| 2020/0025456 | A1 * | 1/2020 | Schroeder | F28F 1/30 |
| 2021/0092827 | A1 | 3/2021 | Karamavruc et al. | |
| 2021/0164421 | A1 * | 6/2021 | Carrera García | F28F 9/005 |
| 2021/0222961 | A1 * | 7/2021 | Takeda | F28D 9/0006 |
| 2021/0382252 | A1 | 12/2021 | Shearman et al. | |
| 2024/0183579 | A1 * | 6/2024 | Deng | F24H 9/0026 |
| 2024/0240870 | A1 | 7/2024 | Tseng et al. | |
| 2024/0320398 | A1 * | 9/2024 | Ma | G06F 30/23 |

\* cited by examiner

MULTI-HEADER PIPE DISTRIBUTING ANNULAR PRINTED CIRCUIT HEAT EXCHANGER

TECHNICAL FIELD

The present invention pertains to the technical field of heat exchangers, and specifically pertains to a multi-header pipe distributing annular printed circuit heat exchanger.

BACKGROUND

Supercritical carbon dioxide power generation is a key technology to realize clean and efficient utilization of coal. A supercritical carbon dioxide power generation system has an operating pressure higher than the critical pressure of carbon dioxide (7.38 MPa), and has the advantages of no phase change, simple structure, facilitating peak regulation or frequency modulation of units, etc. Supercritical carbon dioxide Brayton cycle systems have an efficiency higher than an existing steam Rankine cycle power generation system at 450-650° C., so they have broad application prospects in the fields of coal and nuclear energy. Heat exchangers are the most numerous and largest equipment in supercritical carbon dioxide power generation system, their cost accounts for more than 45% of the total system cost, and their flow and heat transfer performance is one of the key factors affecting the efficiency of the whole cycle. For printed circuit heat exchangers, chemical etching is widely used to manufacture cold and hot heat exchange channels, and diameter thereof is generally 0.5-2 mm; and cold and hot heat exchange plates are alternately stacked and welded by a vacuum diffusion welding technique to form a core body. Due to characteristics of the manufacturing process, the printed circuit heat exchangers have excellent heat transfer performance and high temperature and pressure resistance, and can operate in environments with temperature≥900° C. and pressure≥90 MPa, and their compactness (i.e., surface area/volume ratio) can reach 2500 $m^2/m^3$. Under the same heat load, the volume of printed circuit heat exchanger can be reduced to ⅕ of that of shell-and-tube heat exchanger. In recent years, relevant institutions around the world have carried out a lot of research work on printed circuit heat exchangers.

A core body of an existing printed circuit heat exchanger core is composed of a large number of mini-channels (up to thousands of mini-channels). Flow maldistribution may cause metal wall over-temperature, thermal stress concentration and increased pressure loss of the heat exchanger. It is necessary to provide plate as well as header pipe and head distributing structure to achieve uniform entry of the heat transfer working fluid into the mini-channels.

However, the existing printed circuit heat exchangers generally adopt the distributing structure of the normal temperature and pressure mini-channel heat exchangers, which often faces such design challenges as small heat exchange core body and large distributing structure, resulting in decreased overall compactness of the heat exchanger and significantly increased volume and weight.

SUMMARY

The present invention provides a multi-header pipe distributing annular printed circuit heat exchanger, which can overcome the problem that a distributing structure of a printed circuit heat exchanger occupies a large space in the existing design, and can effectively improve compactness and power density of the heat exchanger, and reduce volume and weight.

In order to solve the above technical problem, the technical solution of the present invention is as follows:

Embodiments of the present invention provide a multi-header pipe distributing annular printed circuit heat exchanger, including:

a front head configured to achieve same side entry and exit of a cold fluid;

a core body, where one end thereof is connected with the front head, the core body includes several cold plates and hot plates stacked in an axial staggered arrangement, the cold plates and the hot plates are both provided with a plurality of cold fluid inlet header pipes and cold fluid outlet header pipes thereon, the cold fluid inlet header pipes and the cold fluid outlet header pipes are both arranged periodically in a circumferential direction, and the cold fluid inlet header pipes and the cold fluid outlet header pipes are arranged at intervals;

the cold plate is provided thereon with several curved cold flow channels arranged periodically in the circumferential direction and located between the cold fluid inlet header pipe and the cold fluid outlet header pipe; the curved cold flow channel includes a cold fluid inlet distributing section, a cold fluid core heat exchange section and a cold fluid outlet confluence section; the hot plate is provided thereon with several curved hot flow channels arranged periodically in the circumferential direction and located between the cold fluid inlet header pipe and the cold fluid outlet header pipe; the curved hot flow channel includes a hot fluid inlet distributing section, a hot fluid core heat exchange section and a hot fluid outlet confluence section; and the cold fluid core heat exchange section is radially aligned with the hot fluid core heat exchange section;

a hot fluid inlet cavity provided in a middle portion formed by stacking the cold plates and the hot plates in the axial staggered arrangement, and configured to achieve entry of a hot fluid;

a shell sheathed outside the core body, where one end of the shell is connected with the front head, and the shell and the core body are provided with a gap for collecting the hot fluid;

a lower cover plate connected with one end of the core body away from the front head and configured to block the hot fluid inlet cavity; and a rear head connected with one end of the shell away from the front head and configured to achieve outflow of the hot fluid.

Further, the front head includes:

a hot fluid inlet middle communicating header provided in a middle portion of the front head and in communication with a cavity in the middle portion of the front head; and a baffle provided on an inner wall of the front head and by which the front head divides an external cavity into an inlet portion and an outlet portion.

Further, the front head further includes:

a cold fluid inlet outer ring header provided on the front head and in communication with an outer annular cavity separated by the baffle; and a cold fluid outlet inner ring header provided on the front head and in communication with an inner annular cavity separated by the baffle.

Further, the front head is provided with an upper cover plate embedded therein;

the upper cover plate is provided with a plurality of outer ring cold fluid inlets and inner ring cold fluid outlets thereon;

the outer ring cold fluid inlet is in communication with the cold fluid inlet outer ring header, and the outer ring cold fluid inlets are arranged periodically in the circumferential direction;

the inner ring cold fluid outlet is in communication with the cold fluid outlet inner ring header, and the inner ring cold fluid outlets are arranged periodically in the circumferential direction; and the outer ring cold fluid inlets and the inner ring cold fluid outlets are arranged at intervals.

Further, the shell is provided with several ribs inside, and the shell is connected with an outer wall of the core body without the curved hot flow channels by the ribs.

Further, one end of the core body away from the front head is connected with the lower cover plate, and the core body blocks the hot fluid inlet cavity by the lower cover plate.

Further, the rear head is provided with a plurality of hot fluid outlet headers thereon.

The above solution of the present invention includes at least the following beneficial effects:

The multi-header pipe distributing annular printed circuit heat exchanger of the present invention has a design of a plurality of inlet and outlet header pipes, and a baffle is placed in the front head to divide the cavity into two portions to achieve same side entry and exit of the cold fluid; the annular heat exchange plate is periodically provided with several curved hot flow channels or curved cold flow channels in the circumferential direction, and the cold flow channel core heat exchange section and the hot flow channel core heat exchange section in the plate flow channel are radially aligned; the middle communicating cylindrical cavity is used as the hot fluid inlet, which helps to increase windward area of the core body of the heat exchanger and reduce pressure drop; at the same time, the plurality of inlets and outlets are used to divide the large number of heat exchange channels regularly, and the number of corresponding channels in each group is reduced, resulting in a better distributing effect; in addition, the annular heat exchanger is a collection of a plurality of heat exchange module units connected in series in the circumferential direction, and a small volume of the units is more conducive to withstanding high pressure by the heat exchanger itself; and the design of distributing by a plurality of fluid inlet and outlet header pipes solves the problem that the distributing structure of the existing printed circuit heat exchanger occupies a large space, which can effectively improve compactness and power density of the heat exchanger, and reduce volume and weight.

Figure 1:
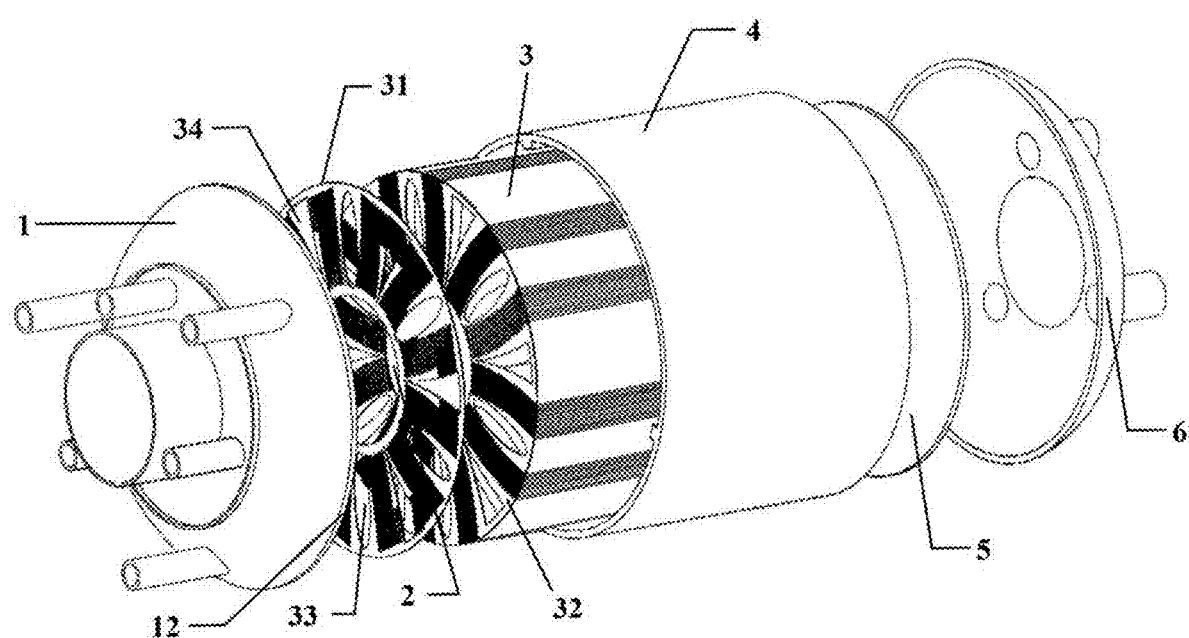
FIG. 1 is a schematic diagram of an overall structure of a multi-header pipe distributing annular printed circuit heat exchanger.

Description of reference numerals: 1. front head; 2. hot fluid inlet cavity; 3. core body; 4. shell; 5. lower cover plate; 6. rear head; 12. upper cover plate; 31. cold plate; 32. hot plate; 33. cold fluid outlet header pipe; 34. cold fluid inlet header pipe; 41. rib; 61. hot fluid outlet header; 111. cold fluid inlet outer ring header; 112. cold fluid outlet inner ring header; 113. hot fluid inlet middle communicating header; 114. baffle; 121. outer ring cold fluid inlet; 122. inner ring cold fluid outlet; 311. cold fluid inlet distributing section; 312. cold fluid core heat exchange section; 313. cold fluid outlet confluence section; 321. hot fluid inlet distributing section; 322. hot fluid core heat exchange section; and 323. hot fluid outlet confluence section.

DESCRIPTION OF THE EMBODIMENTS

Exemplary embodiments of the present invention will be described in more detail below with reference to the accompanying drawings. While the drawings show exemplary embodiments of the present invention, it should be understood that the present invention may be embodied in various forms and should not be construed as limited to the embodiments set forth herein. Rather, these embodiments are provided so that the present invention will be thorough and complete, and will fully convey the scope of the present invention to those skilled in the art.

As shown in FIGS. 1-12, embodiments of the present invention provide a multi-header pipe distributing annular printed circuit heat exchanger, including:

a front head 1 configured to achieve same side entry and exit of a cold fluid;

a core body 3, where one end thereof is connected with the front head 1, the core body 3 includes several cold plates 31 and hot plates 32 stacked in an axial staggered arrangement, the cold plate 31 and the hot plate 32 are both provided with a plurality of cold fluid inlet header pipes 34 and cold fluid outlet header pipes 33 thereon, the cold fluid inlet header pipes 34 and the cold fluid outlet header pipes 33 are both arranged periodically in a circumferential direction, and the cold fluid inlet header pipes 34 and the cold fluid outlet header pipes 33 are arranged at intervals;

the cold plate 31 is provided thereon with several curved cold flow channels arranged periodically in the circumferential direction and located between the cold fluid inlet header 34 and the cold fluid outlet header 33; the curved cold flow channel include a cold fluid inlet distributing section 311, a cold fluid core heat exchange section 312 and a cold fluid outlet confluence section 313; the hot plate 32 is provided thereon with several curved hot flow channels arranged periodically in the circumferential direction and located between the cold fluid inlet header 34 and the cold fluid outlet header 33; the curved hot flow channel includes a hot fluid inlet distributing section 321, a hot fluid core heat exchange section 322 and a hot fluid outlet confluence section 323; and the cold fluid core heat exchange section 312 is radially aligned with the hot fluid core heat exchange section 322;

a hot fluid inlet cavity 2 provided in a middle portion formed by stacking the cold plates 31 and the hot plates 32 in the axial staggered arrangement, and configured to achieve entry of hot fluid;

a shell 4 sheathed outside the core body 3, where one end of the shell 4 is connected with the front head 1, and the shell 4 and the core body 3 are provided with a gap for collecting hot fluid;

a lower cover plate 5 connected with one end of the core body 3 away from the front head 1 and configured to block the hot fluid inlet cavity 2; and a rear head 6 connected with one end of the shell 4 away from the front head 1 and configured to achieve outflow of hot fluid.

In the embodiments of the present invention, the front head 1, the rear head 6 and the core body 3 have a design of a plurality of inlet and outlet header pipes, and the cavity in the front head is divided into two portions to achieve the same side entry and exit of the cold fluid; a plurality of curved hot flow channels or curved cold flow channels are periodically arranged in the circumferential direction in the core body 3, and the cold fluid core heat exchange section 312 and the hot fluid core heat exchange section 322 in the plate flow channel are radially aligned; at the same time, the plurality of inlets and outlets are used to divide the large number of heat exchange channels regularly, and the number of corresponding channels in each group is reduced, resulting in a better distributing effect; in addition, the annular heat exchanger is a collection of a plurality of heat exchange module units connected in series in the circumferential direction, and a small volume of the units is more conducive to withstanding high pressure by the heat exchanger itself; the design of distributing by a plurality of fluid inlet and outlet header pipes solves the problem that the distributing structure of the existing printed circuit heat exchanger has a large footprint, which can effectively improve compactness and power density of the heat exchanger, and reduce volume and weight; the cold fluid enters through a plurality of cold fluid inlet header pipes 34 penetrating through the core body 3 of the annular heat exchanger with flow uniformly distributed to each cold plate 31, then symmetrically enters the cold fluid heat exchange channels arranged periodically in the circumferential direction, and finally flows out from a plurality of cold fluid outlet header pipes 33 penetrating through the core body 3 of the annular heat exchanger; the hot fluid enters through a middle communicating cylindrical cavity inside the core body 3 of the annular heat exchanger with flow uniformly distributed to each hot plate 32, then enters the hot fluid heat exchange channel for heat exchange, the hot fluid that has participated in the heat exchange flows out from an outside of the core body 3, and finally flows out from the rear head 6; and the whole heat exchange process includes cross-flow heat exchange of the cold and hot fluids in the distributing and confluence sections and counterflow heat exchange in the core heat exchange sections.

In the embodiments of the present invention, the cold plate 31 and the hot plate 32 may be stacked in a staggered manner of "one cold plate and one hot plate" or a sandwiched manner of "two cold plates and one hot plate" and "two hot plates and one cold plate", the several cold plates 31 and hot plates 32 stacked in an axial staggered arrangement from front to rear may be welded by diffusion bonding and brazing, a front end of the heat exchanger is connected with the upper cover plate 12 by one cold plate 31, and a rear end of the heat exchanger is connected with the lower cover plate 5 by another cold plate 31; the cold plate 31 and the hot plate 32 respectively have several curved cold flow channels and curved hot flow channels arranged periodically in the circumferential direction, and a certain distance is left on an inner edge and an outer edge of the plates, so that the upper cover plate 12 and the lower cover plate 5 are respectively arranged at the front end and the rear end of the heat exchanger, which also facilitates welding between the cold and hot plates of the heat exchanger core body 3; and the cold plates 31 and the hot plates 32 are stacked to form a middle communicating hot fluid inlet cavity 2, which can make full use of space to reduce the volume of the heat exchanger, improve the compactness, increase windward area and reduce pressure drop.

Figure 2:
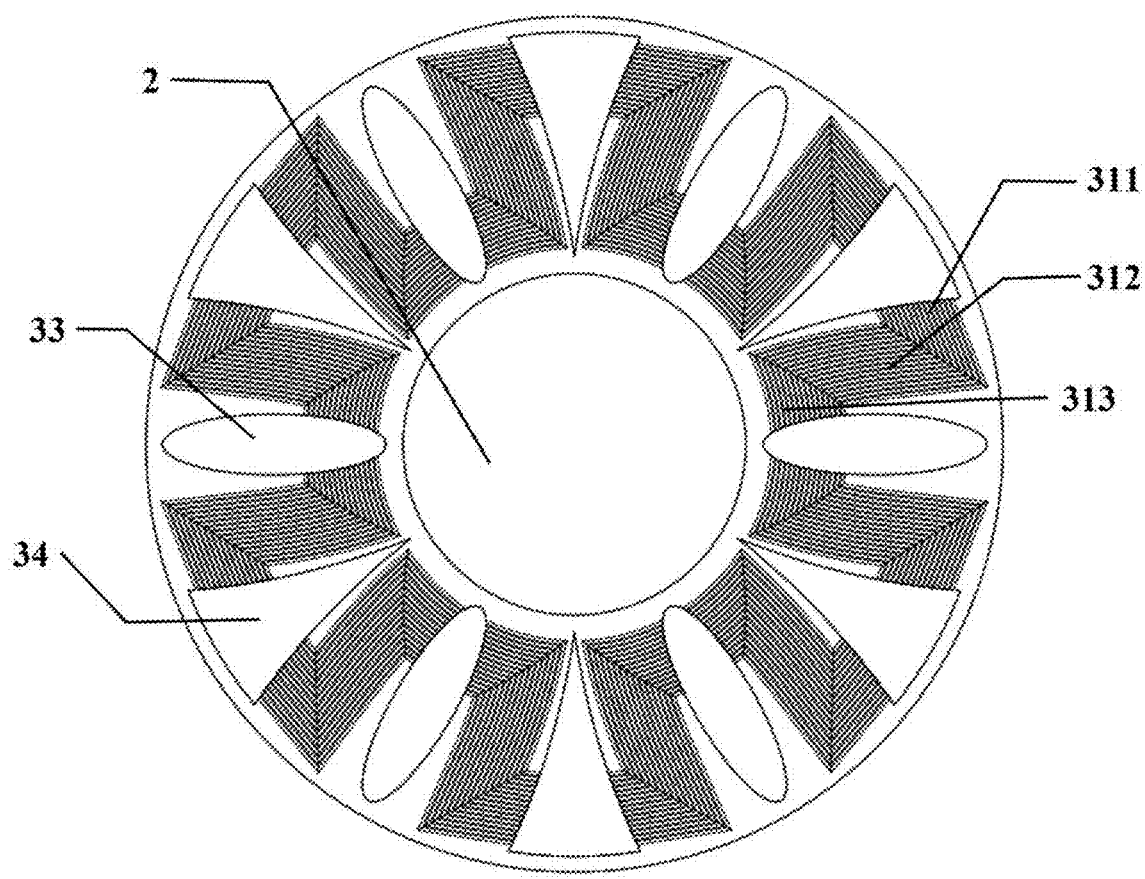
FIG. 2 is a structural schematic diagram of a cold plate of a multi-header pipe distributing annular printed circuit heat exchanger.
Figure 3:
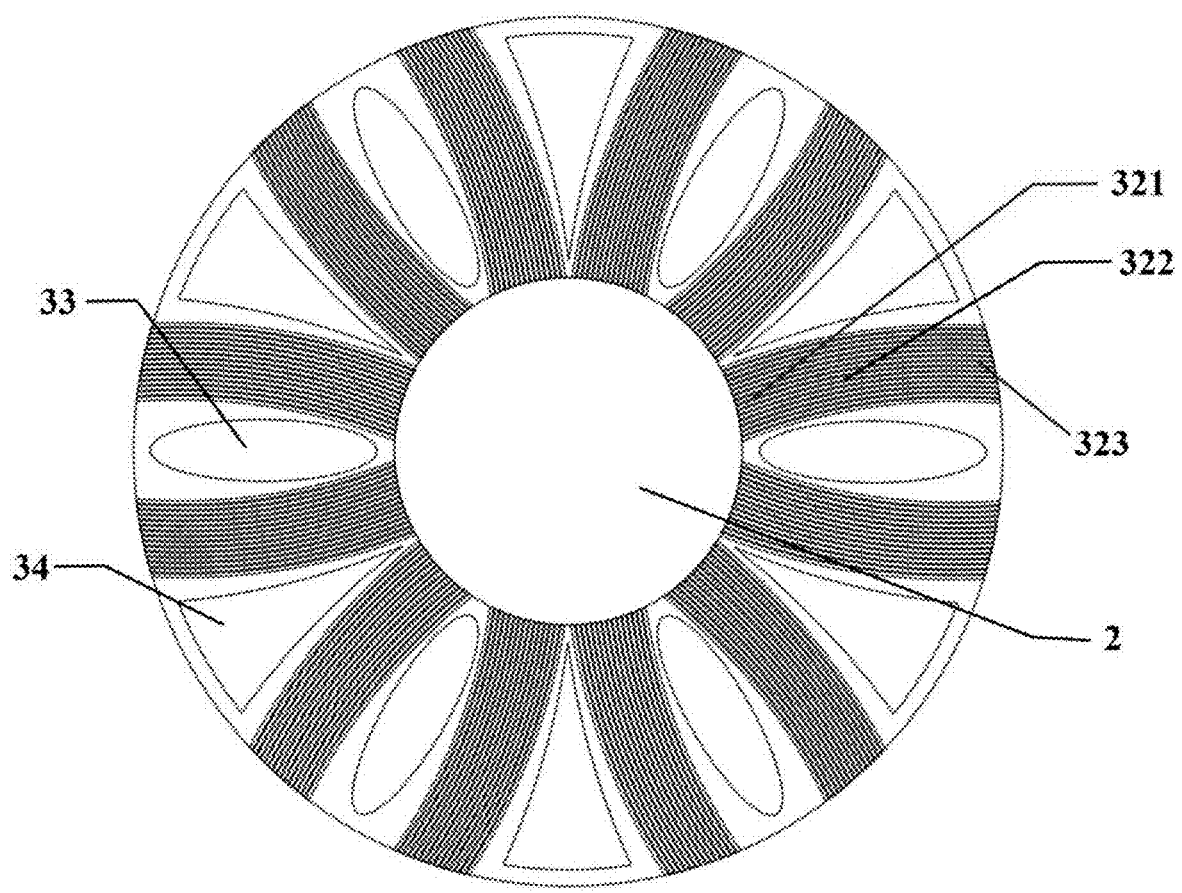
FIG. 3 is a structural schematic diagram of a hot plate of a multi-header pipe distributing annular printed circuit heat exchanger.
Figure 4:
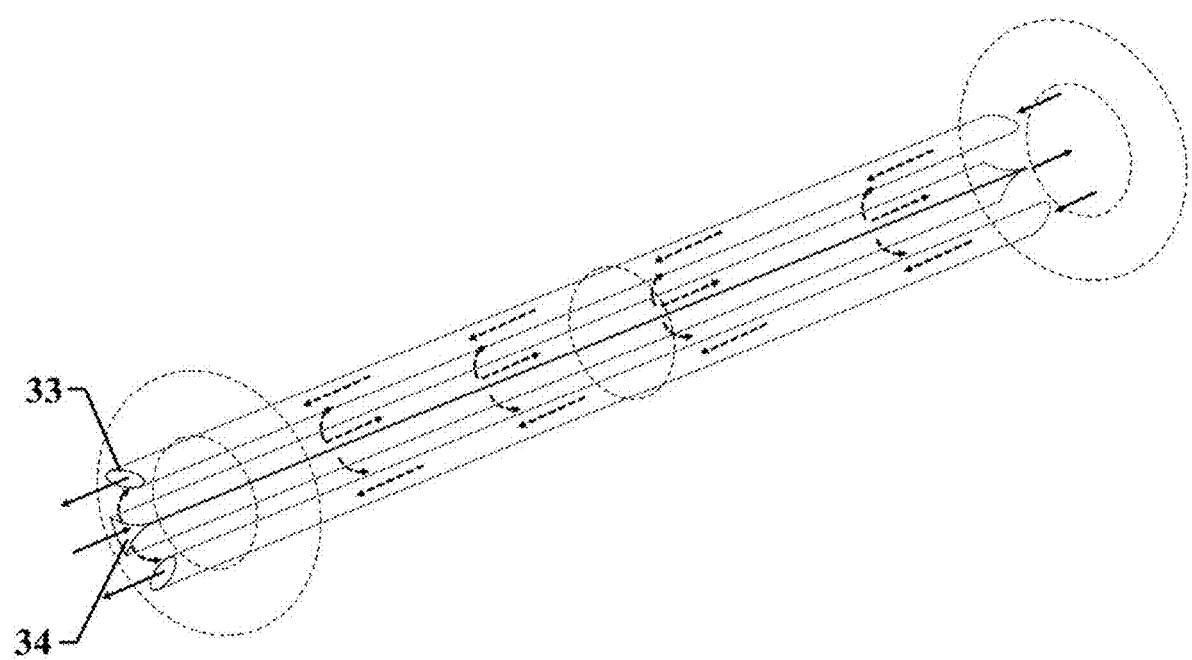
FIG. 4 is a schematic diagram of a cold fluid flow pattern of a multi-header pipe distributing annular printed circuit heat exchanger.
Figure 5:
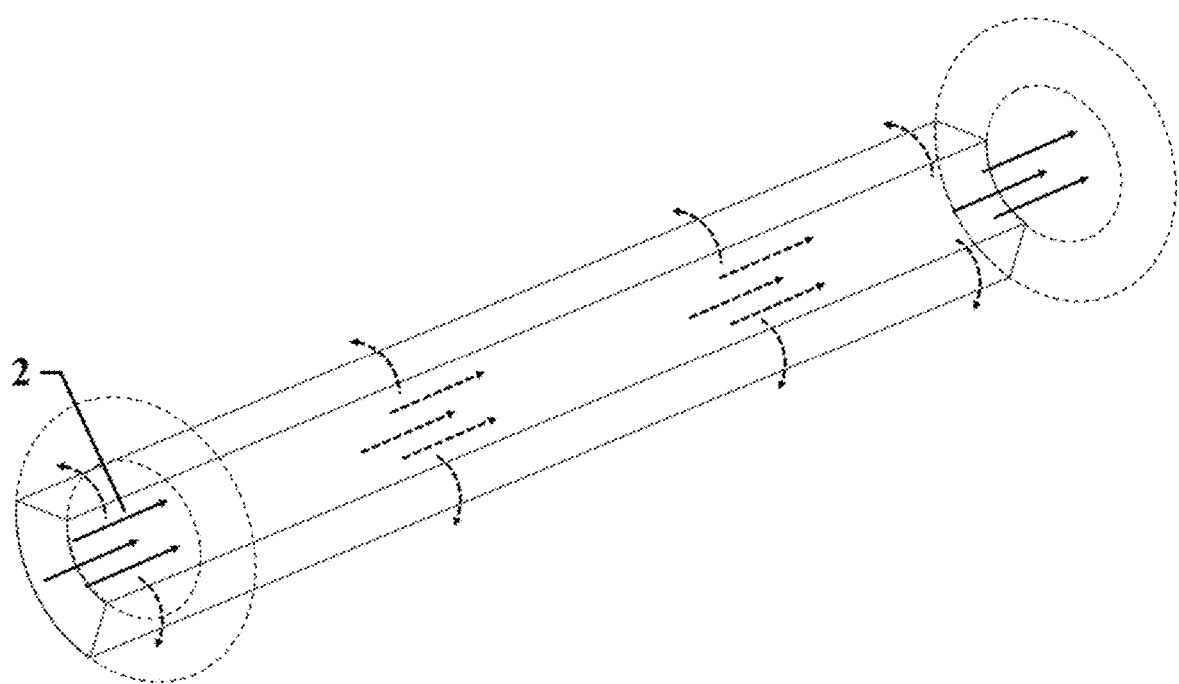
FIG. 5 is a schematic diagram of a hot fluid flow pattern of a multi-header pipe distributing annular printed circuit heat exchanger.
Figure 6:
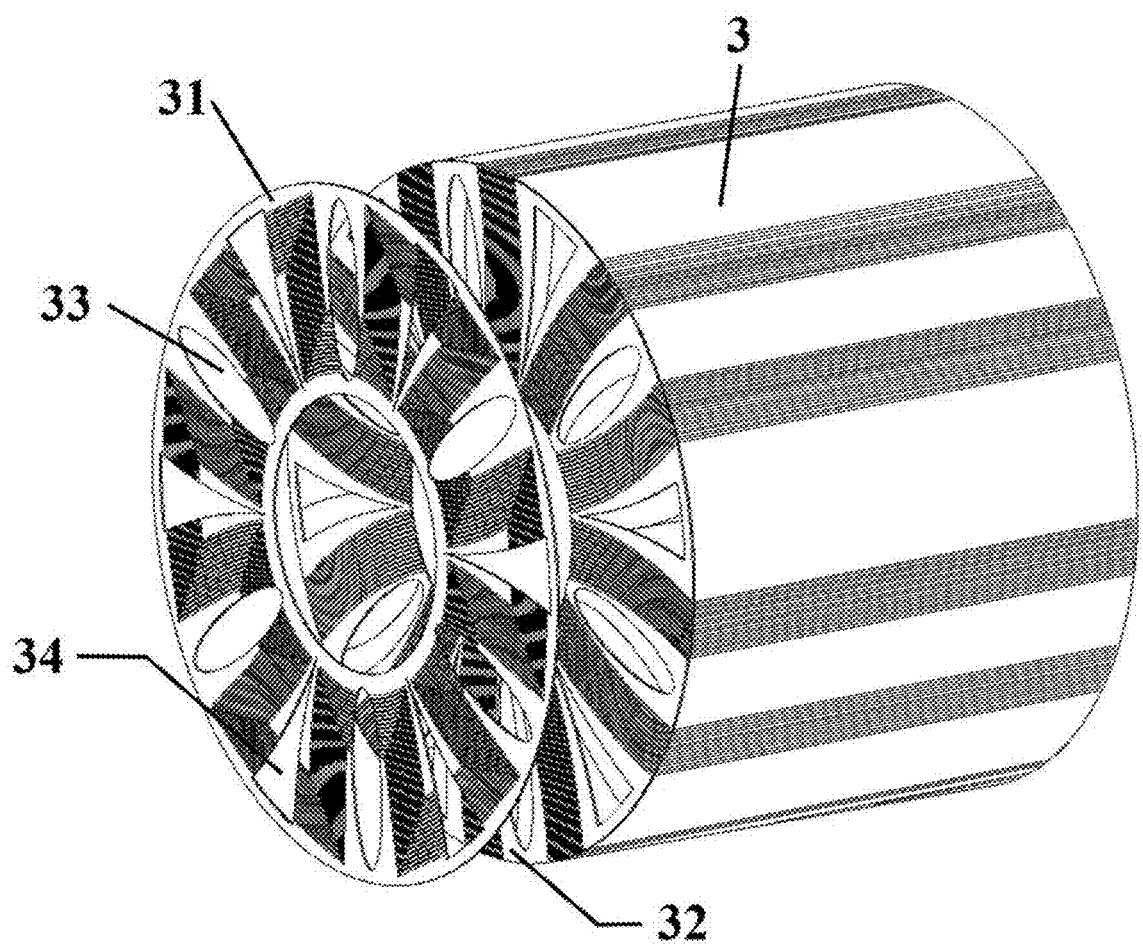
FIG. 6 is a structural schematic diagram of a core body of a multi-header pipe distributing annular printed circuit heat exchanger.

In the embodiments of the present invention, with reference to FIGS. 2 and 4, the plurality of cold fluid inlet header pipes 34 and cold fluid outlet header pipes 33 are integrally and periodically arranged in the circumferential direction, and reduction of the number of channels in the annular heat exchanger unit can improve flow distribution uniformity of the working fluid, and ensure consistency of pressure difference between an inlet and an outlet of each cold fluid channel along an axial direction of the heat exchanger; and the small volume of the units is more conducive to enhancing pressure bearing capacity of the heat exchanger itself, which can overcome the problem that the distributing structure has a large footprint in the existing design, improve the compactness and power density of the heat exchanger, and reduce the volume and weight; a cross section of the cold fluid inlet header pipe 34 is a triangle with a certain curvature on a borderline, and a cross section of the cold fluid outlet header pipe 33 is an oval, and a ratio of an area $A_i$ of the cross section of the triangular cold fluid inlet header pipe 34 with a certain curvature on the borderline and an area $A_e$ of the cross section of the oval cold fluid outlet header pipe 33 is constant, and can be calculated according to $$\frac{A_i}{A_e} = \left[\frac{\rho_e}{2\rho_i}\right]^{\frac{1}{2}},$$

where $\rho_i$ is a density of the cold fluid at the inlet header pipe, and $\rho_e$ is a density of the cold fluid at the outlet header pipe, and under the ratio, the consistency of the pressure difference between the inlet and the outlet of each cold fluid channel along the axial direction of the heat exchanger is the best; the cold plate 31 is provided thereon a plurality of cold fluid heat exchange channels arranged periodically in the circumferential direction, and the cold fluid heat exchange channels are respectively composed of a cold fluid inlet distributing section 311, a cold fluid core heat exchange section 312 and a cold fluid outlet confluence section 313 from the inlet to the outlet; the cold fluid heat exchange channels are in a zigzag shape and are all curved flow channels; taking a heat exchange unit as an example, the cold fluid is firstly distributed to each cold fluid heat exchange plate by the cold fluid inlet header pipe 34, absorbs heat from the hot fluid heat exchange channels by means of convective heat transfer, and then flows out from the cold fluid outlet header pipe 33; profiles of an outer ring cold fluid inlet 121 and an inner ring cold fluid outlet 122 are respectively aligned with the triangular cold fluid inlet header pipe 34 and the oval cold fluid outlet header pipe 33, and such a structure can achieve the same side entry and exit of the cold fluid by using different arrangements of the cold fluid inlet distributing section and the cold fluid outlet confluence section 313 on the cold plate 31; the curved cold flow channel and the curved hot flow channel are respectively arranged on the cold plate 31 and the hot plate 32 at a certain distance in the circumferential direction, two adjacent groups of cold flow channels or hot flow channels are symmetrically distributed with respect to the cold fluid inlet or outlet, and the cold fluid heat exchange section and the hot fluid heat exchange section are curved continuous flow channels or non-continuous flow channels; and the cold and hot flow channels may be manufactured by chemical etching, machining, additive manufacturing, etc.

As shown in FIGS. 1 to 12, the front head 1 includes:
a hot fluid inlet middle communicating header 113 provided in a middle portion of the front head 1 and in communication with the cavity in the middle portion of the front head 1; and
a baffle 114 provided on an inner wall of the front head 1, where the front head 1 divides an external cavity into an inlet portion and an outlet portion by the baffle 114.
The front head 1 further includes:
a cold fluid inlet outer ring header 111 provided on the front head 1 and in communication with an outer annular cavity separated by the baffle 114; and
a cold fluid outlet inner ring header 112 provided on the front head 1 and in communication with an inner annular cavity separated by the baffle 114.

Figure 7:
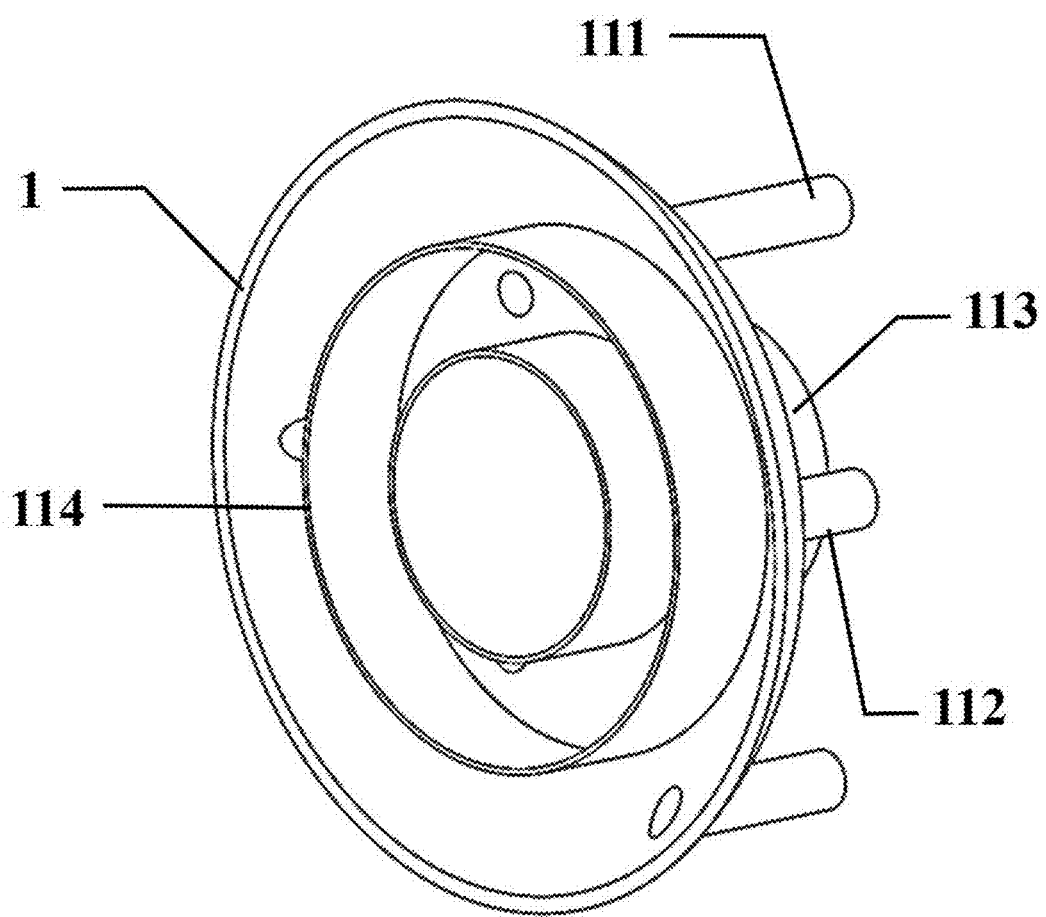
FIG. 7 is a structural schematic diagram of a front head of a multi-header pipe distributing annular printed circuit heat exchanger.
Figure 8:
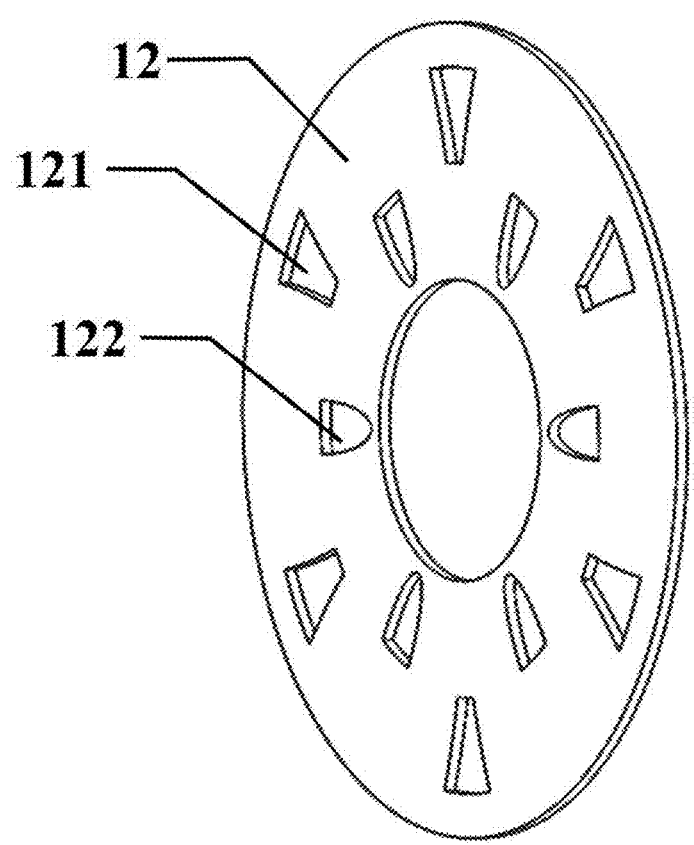
FIG. 8 is a structural schematic diagram of an upper cover plate of a multi-header pipe distributing annular printed circuit heat exchanger.

In the embodiments of the present invention, with reference to FIGS. 7 and 8, the front head 1 is composed of the hot fluid inlet middle communicating header 113, the cold fluid outlet inner ring header 112, the cold fluid inlet outer ring header 111, the baffle 114 and the upper cover plate 12. The front head 1 has a semi-spherical shape and is easy to withstand high pressure, and the baffle 114 is placed in the front head 1 and can divide the cavity into two portions to achieve the same side entry and exit of the cold fluid and avoid mixed flow of the working fluid; and the plurality of cold fluid inlet outer ring headers 111 and the cold fluid outlet inner ring headers 112 are periodically arranged from inner and outer sides of the baffle 114 in the circumferential direction.

As shown in FIGS. 1-12, the front head 1 is provided with the upper cover plate 12 embedded therein; the upper cover plate 12 is provided thereon with a plurality of outer ring cold fluid inlets 121 and inner ring cold fluid outlets 122; the outer ring cold fluid inlet 121 is in communication with the cold fluid inlet outer ring header 111, and the outer ring cold fluid inlet 121 is periodically arranged in the circumferential direction; the inner annular cold fluid outlet 122 is in communication with the cold fluid outlet inner annular header 112, and the inner ring cold fluid outlet 122 is periodically arranged in the circumferential direction; and the outer ring cold fluid inlet 121 and the inner ring cold fluid outlet 122 are arranged at intervals.

In the embodiments of the present invention, the upper cover plate 12 is provided with a plurality of outer ring cold fluid inlets 121 and inner ring cold fluid outlets 122, the outer ring cold fluid inlets 121 are connected with the cold fluid inlet outer ring header 111, and the inner ring cold fluid outlets 122 are connected with the cold fluid outlet inner ring header 112; and a thickness of the baffle 114 depends on a spacing between inner edges of the outer ring cold fluid inlet 121 and the inner ring cold fluid outlet 122 in the upper cover plate 12.

As shown in FIGS. 1 to 12, the shell 4 is provided with several ribs 41 inside, and the shell 4 is connected with an outer wall of the core body 3 without the curved hot flow channels by the ribs 41.

Figure 9:
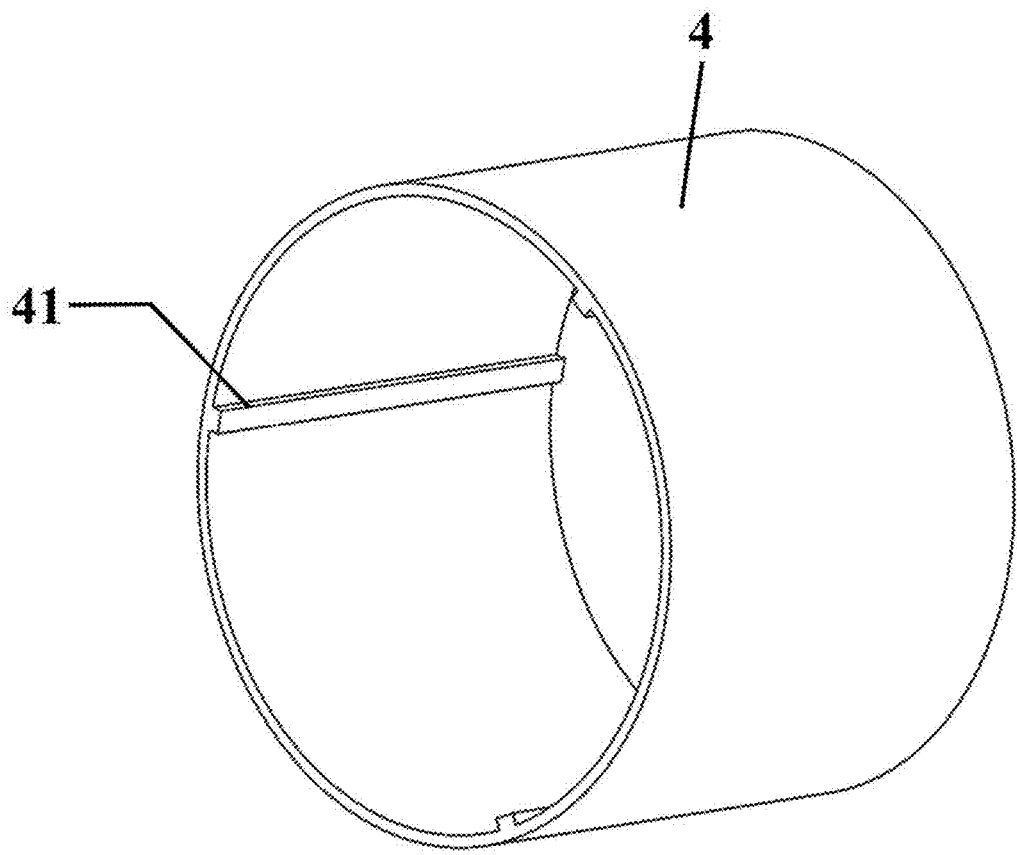
FIG. 9 is a structural schematic diagram of a shell of a multi-header pipe distributing annular printed circuit heat exchanger.

In the embodiments of the present invention, with reference to FIG. 9, the shell 4 is generally cylindrical, is sheathed on a periphery of the core body 3, and has a certain gap from the core body 3 for collecting the hot fluid; and a plurality of ribs 41 are arranged on an inside of the shell 4 for welding with the core body 3 at a position without flow channel, and the hot fluid can be collected in different sections.

As shown in FIGS. 1-12, one end of the core body 3 away from the front head 1 is connected with the lower cover plate 5, and the core body 3 blocks the hot fluid inlet cavity 2 by the lower cover plate 5.

Figure 10:
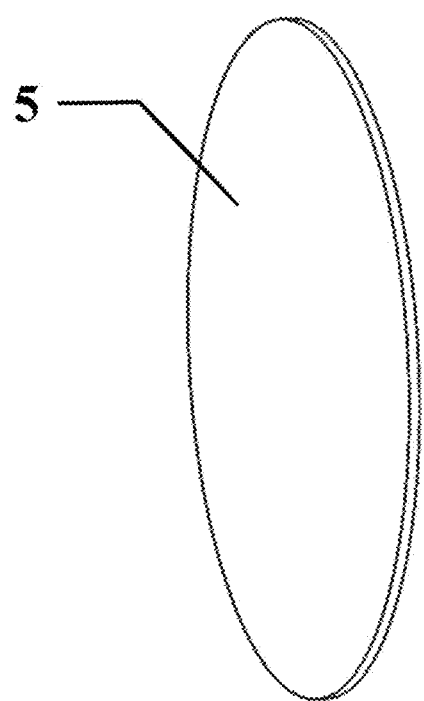
FIG. 10 is a structural schematic diagram of a lower cover plate of a multi-header pipe distributing annular printed circuit heat exchanger.

In the embodiments of the present invention, with reference to FIG. 10, the lower cover plate 5 is circular in cross section and can be used to block the hot fluid inlet cavity 2, prevent leakage of the working fluid, and cooperates with the rear head 6 to form a hot fluid outlet cavity to collect the hot fluid flowing out from the outside of the core body 3.

As shown in FIGS. 1 to 12, the rear head 6 is provided with a plurality of hot fluid outlet headers 61 thereon.

Figure 11:
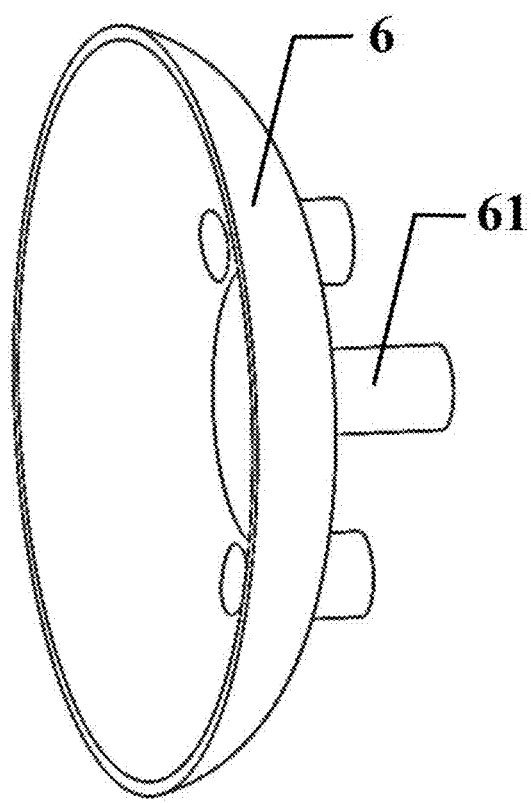
FIG. 11 is a structural schematic diagram of a rear head of a multi-header pipe distributing annular printed circuit heat exchanger.

In the embodiments of the present invention, with reference to FIG. 11, the rear head 6 has a semi-spherical shape, and a plurality of hot fluid outlet headers 61 are periodically arranged in the circumferential direction; and the hot fluid that has participated in heat exchange flows out from the outside of the core body 3, enters the hot fluid cavity, and flows out from the hot fluid outlet header 61.

The working principle is as follows: the cold fluid enters through the plurality of cold fluid inlet header pipes 34 penetrating through the core body 3 of the annular heat exchanger with the flow uniformly distributed to each cold plate 31, then symmetrically enters the cold fluid heat exchange channels arranged periodically in the circumferential direction, successively passes through the cold fluid inlet distributing section 311, the cold fluid core heat exchange section 312 and the cold fluid outlet confluence section 313, and finally flows out from the plurality of cold fluid outlet header pipes 33 penetrating through the core body 3 of the annular heat exchanger; the hot fluid enters through the middle communicating cylindrical cavity inside the core body 3 of the annular heat exchanger with the flow uniformly distributed to each hot plate 32, successively passes through the hot fluid inlet distributing section 321, the hot fluid core heat exchange section 322 and the hot fluid outlet confluence section 323, then enters the gap between the shell 4 and the core body 3, then enters the hot fluid outlet cavity formed by the lower cover plate 5 and the rear head 6, and finally flows out from the hot fluid outlet header 61; and the whole heat exchange process includes cross-flow heat exchange of the cold and hot fluids in the distributing and confluence sections and counterflow heat exchange in the core heat exchange sections.

The existing printed circuit heat exchanger has a design of a pair of inlet and outlet and a head on both cold and hot sides, while the annular printed circuit heat exchanger provided by the present invention can achieve the same side entry and exit of the cold fluid, the core body consists of the middle communicating cylindrical cavity as the hot fluid inlet and a plurality of cold fluid inlets and outlets integrated thereon, and the middle communicating cylindrical cavity helps to increase the windward area of the core body of the heat exchanger and reduce the pressure drop; at the same time, the plurality of inlets and outlets are used to divide the large number of heat exchange channels regularly, and the number of corresponding channels in each group is reduced, resulting in a better distributing effect; in addition, the annular heat exchanger has the with a small volume, which is more conducive to withstanding high pressure by the heat exchanger itself, and the design of distributing by the plurality of fluid inlet and outlet header pipes solves the problem that the distributing structure of the existing printed circuit heat exchanger has a large footprint, which can effectively improve the compactness and power density of the heat exchanger, and reduce the volume and weight.

Figure 12:
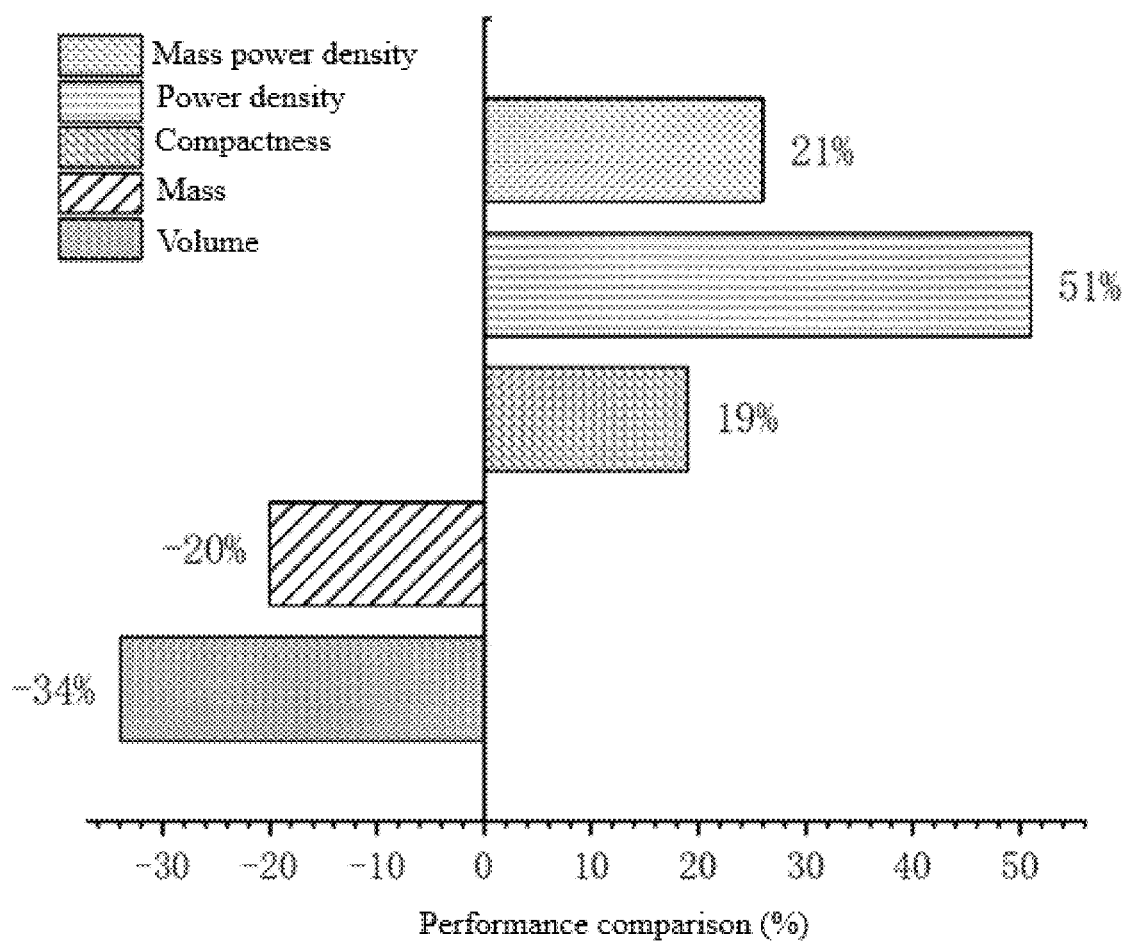
FIG. 12 is a graph of performance comparison between the present invention resulting from a thermal design and conventional printed circuit heat exchanger.

As shown in FIG. 12, a thermal design method was used to compare the existing printed circuit heat exchanger with the multi-inlet and outlet integrated annular printed circuit heat exchanger provided by the present invention. In the design process, supercritical carbon dioxide with a massflow of 0.3 kg/s was used as the working fluid for both the hot and cold sides, with an inlet temperature of 425° C. and a pressure of 8.5 MPa at the hot side, and an inlet temperature of 80° C., a pressure of 20 MPa at the cold side. The total heat load of the heat exchanger is 120 kW. The thermal design results show that, compared with the existing printed circuit heat exchanger, the multi-inlet and outlet integrated annular printed circuit heat exchanger provided by the present invention has significantly reduced volume and weight, and has greatly improved compactness, power density and mass power density.

The present invention has been described with reference to the foregoing preferred embodiments. It should be noted that those of ordinary skill in the art can make several improvements and modifications without departing from the principles of the present invention, and such improvements and modifications shall be construed to fall into the scope of the present invention.

For details not described in this embodiment of the disclosure, please refer to the description in each of above embodiments.

What is claimed is:

1. A multi-header pipe distributing annular printed circuit heat exchanger, comprising:
a front head configured to achieve same side entry and exit of a cold fluid;
a core body, one end thereof being connected with the front head, the core body comprising several cold plates and hot plates stacked in an axial staggered arrangement, each of the cold plates and each of the hot plates being both provided with a plurality of cold fluid inlet header pipes and cold fluid outlet header pipes thereon, the cold fluid inlet header pipes and the cold fluid outlet header pipes being both arranged periodically in a circumferential direction, and the cold fluid inlet header pipes and the cold fluid outlet header pipes being arranged at intervals;
each of the cold plates being provided thereon with several curved cold flow channels arranged periodically in the circumferential direction and the curved cold flow channels located between the cold fluid inlet header pipes and the cold fluid outlet header pipes; each of the curved cold flow channels comprising a cold fluid inlet distributing section, a cold fluid core heat exchange section and a cold fluid outlet confluence section; each of the hot plates being provided thereon with several curved hot flow channels arranged periodically in the circumferential direction and the curved hot flow channels located between the cold fluid inlet header pipes and the cold fluid outlet header pipes; each of the curved hot flow channels comprising a hot fluid inlet distributing section, a hot fluid core heat exchange section and a hot fluid outlet confluence section; and the cold fluid core heat exchange section being radially aligned with the hot fluid core heat exchange section;
a hot fluid inlet cavity provided in a middle portion formed by stacking the cold plates and the hot plates in the axial staggered arrangement, and configured to achieve entry of a hot fluid;
a shell sheathed outside the core body, one end of the shell being connected with the front head, and the shell and the core body being provided with a gap for collecting the hot fluid;
a lower cover plate connected with one end of the core body away from the front head and configured to block the hot fluid inlet cavity;
a rear head connected with the other end of the shell away from the front head and configured to achieve outflow of the hot fluid; the front head comprising:
a hot fluid inlet middle communicating header provided in a middle portion of the front head and in communication with a cavity in the middle portion of the front head; and
a baffle provided on an inner wall of the front head and by which the front head dividing an external cavity into an inner annular cavity and an outer annular cavity; the front head further comprising:
a cold fluid inlet outer ring header provided on the front head and in communication with the outer annular cavity separated by the baffle; and
a cold fluid outlet inner ring header provided on the front head and in communication with the inner annular cavity separated by the baffle; and the front head is provided with an upper cover plate embedded therein;
the upper cover plate being provided with a plurality of outer ring cold fluid inlets and inner ring cold fluid outlets thereon;
each of the outer ring cold fluid inlets being in communication with the cold fluid inlet outer ring header, and the outer ring cold fluid inlets being arranged periodically in the circumferential direction;
each of the inner ring cold fluid outlets being in communication with the cold fluid outlet inner ring header, and the inner ring cold fluid outlets being arranged periodically in the circumferential direction; and
the outer ring cold fluid inlets and the inner ring cold fluid outlets being arranged at intervals.

2. The multi-header pipe distributing annular printed circuit heat exchanger according to claim 1, wherein the shell is provided with several ribs inside, and the shell is connected with an outer wall of the core body without the curved hot flow channels by the ribs.

3. The multi-header pipe distributing annular printed circuit heat exchanger according to claim 2, wherein said one end of the core body away from the front head is connected with the lower cover plate, and the core body blocks the hot fluid inlet cavity by the lower cover plate.

4. The multi-header pipe distributing annular printed circuit heat exchanger according to claim 3, wherein the rear head is provided with a plurality of hot fluid outlet headers thereon.

\* \* \* \* \*